US 6,815,311 B2

(12) United States Patent
Hong et al.

(10) Patent No.: US 6,815,311 B2
(45) Date of Patent: Nov. 9, 2004

(54) METHOD FOR FABRICATING SEMICONDUCTOR MEMORY DEVICE

(75) Inventors: Ji Suk Hong, Kyoungki-do (KR); Chul Chan Choi, Kyoungki-do (KR)

(73) Assignee: Hynix Semiconductor Inc., Ichon-shi (KR)

( * ) Notice: Subject to any disclaimer, the term of this patent is extended or adjusted under 35 U.S.C. 154(b) by 0 days.

(21) Appl. No.: 10/098,524

(22) Filed: Mar. 18, 2002

(65) Prior Publication Data

US 2003/0045071 A1 Mar. 6, 2003

(30) Foreign Application Priority Data

Aug. 30, 2001 (KR) .................................. 2001-0052867

(51) Int. Cl.⁷ ............................................. H01L 21/76
(52) U.S. Cl. ..................... 438/433; 438/514; 438/637; 438/675; 438/701; 438/761; 438/778; 438/798; 438/961
(58) Field of Search ............................. 438/514, 637, 438/638, 640, 675, 694, 701, 761, 778, 798, 961, FOR 388, FOR 401, 218, 221, 424, 433, FOR 154

(56) References Cited

U.S. PATENT DOCUMENTS

| 5,192,697 | A | * | 3/1993 | Leong ......................... 438/624 |
| 5,714,037 | A | * | 2/1998 | Puntambekar et al. ...... 438/694 |
| 5,738,731 | A |   | 4/1998 | Shindo et al. |
| 5,747,381 | A | * | 5/1998 | Wu et al. .................... 438/624 |
| 6,074,915 | A |   | 6/2000 | Chen et al. |
| 6,162,743 | A | * | 12/2000 | Chu et al. .................... 438/781 |
| 6,271,127 | B1 | * | 8/2001 | Liu et al. ..................... 438/638 |
| 6,319,837 | B1 | * | 11/2001 | Chittipeddi et al. ........ 438/692 |
| 6,407,399 | B1 | * | 6/2002 | Livesay .................... 250/492.3 |
| 6,458,430 | B1 | * | 10/2002 | Bernstein et al. ........... 427/525 |
| 2001/0010378 | A1 | * | 8/2001 | Matsubara et al. ......... 257/303 |
| 2002/0090832 | A1 | * | 7/2002 | Koh et al. ................... 438/781 |
| 2002/0106890 | A1 | * | 8/2002 | Ahn et al. ................... 438/622 |
| 2002/0132494 | A1 | * | 9/2002 | Hsieh ......................... 438/778 |
| 2002/0139773 | A1 | * | 10/2002 | Gabriel et al. ................. 216/62 |
| 2002/0160320 | A1 | * | 10/2002 | Shields et al. .............. 430/328 |
| 2002/0160545 | A1 | * | 10/2002 | Anderson et al. ............. 438/22 |
| 2002/0164877 | A1 | * | 11/2002 | Catabay et al. ............. 438/694 |
| 2003/0003407 | A1 | * | 1/2003 | Ko et al. .................... 430/328 |
| 2003/0003683 | A1 | * | 1/2003 | Ko et al. .................... 438/445 |
| 2003/0064315 | A1 | * | 4/2003 | Choi et al. ............... 430/270.1 |

* cited by examiner

Primary Examiner—George Fourson
Assistant Examiner—Joannie Adelle Garcia
(74) Attorney, Agent, or Firm—Piper Rudnick LLP

(57) ABSTRACT

A method for fabricating a semiconductor memory device is provided to increase the etch selectivity of photoresist by changing the matter properties thereof in forming a trench isolation region. The method includes the steps of: depositing first and second insulating layers on a semiconductor substrate where a shallow trench isolation (STI) region and a deep trench isolation (DTI) region are defined; forming the STI region by selectively etching the second and first insulating layers and the semiconductor substrate; forming a photoresist to cover the STI region and curing the surface of the photoresist; and forming the DTI region by using the cured photoresist and the second insulating layer as a mask.

8 Claims, 6 Drawing Sheets

METHOD FOR FABRICATING SEMICONDUCTOR MEMORY DEVICE

BACKGROUND OF THE INVENTION

1. Field of the Invention

The present invention relates to a method for fabricating a semiconductor memory device and, more particularly, to a method for forming trench isolation regions of different depths.

2. Description of the Prior Art

A NAND type flash memory device has a plurality of memory cells connected in series, with one common diffusion layer. Therefore, the plurality of memory cells share one input/output line (bit line) and contact.

The NAND type flash memory device has several disadvantages; the random read speed is slower than a NOR type flash memory device and data programming and erasing are performed in a single unit comprising a plurality of cells connected in series to NAND cell array. However, the advantage of the NAND type flash memory device is the small cell area, which lowers the production cost per bit.

Recently, in the NAND type flash memory device, there is an attempt to deepen silicon etching depth, targeted to shallow trench isolation (STI), to 8000 Å. This method is referred to as deep trench isolation (DTI).

The conventional DTI method for fabricating semiconductor memory devices will be described with reference to annexed drawings FIGS. 1A to 1D.

Referring to FIG. 1A, an STI formation region and a DTI formation region are defined on a semiconductor substrate 10. On the surface of the semiconductor substrate 10, a first insulating layer 11, a second insulating layer 12 and a third insulation layer 13 are sequentially deposited. The first insulating layer 11 is a pad oxide layer, the second insulating layer 12 is a pad nitride layer, and the third insulating layer 13 is an oxide hard mask layer. Subsequently, a first photoresist 14 is deposited on the third insulating layer 13 and is exposed and developed to selectively pattern the photoresist.

Referring to FIG. 1B, the first insulating layer 11, the second insulating layer 12, the third insulating layer 13 and the semiconductor substrate 10 are selectively etched off by using the patterned first photoresist 14 as a mask, thereby forming a plurality of STI regions 15a, 15b. The STI regions 15a, 15b have a depth of 2500~3000 Å from the surface of the semiconductor substrate 10.

Referring to FIG. 1C, the patterned first photoresist 14 is removed and a second photoresist 16 is deposited and selectively patterned by exposure and development processes to expose a DTI formation region. The second photoresist 16 has a thickness of 1~3 μm.

Referring to FIG. 1D, the STI region of 15b of the semiconductor substrate 10 is etched more deeply by using the patterned second photoresist 16 and the third insulating layer 13 as a mask, thereby forming a DTI region 17. The DTI region 17 has a depth of 7000~8000 Å from the surface of the semiconductor substrate 10.

As described above, the conventional DTI process requires additional steps to form the hard mask 13 and the DTI region 17 compared to the conventional STI process. Here, the photoresist has insufficient etch selectivity (0.9:1) relative to silicon. Therefore, the second photoresist 16 is etched off in silicon etch process to form the DTI region 17. As a result, the STI region is damaged, thereby causing poor operation of the semiconductor device as shown in a SEM photograph of FIG. 2. In order to prevent this problem, the third insulating layer 13 is employed as a hard mask in the conventional DTI process.

However, the third insulating layer 13 is additionally formed regardless of the original purpose, thereby complicating the fabrication process and increasing the production cost. Moreover, interfacial disharmony between the third insulating layer 13 and the photoresist 14 and 16 cause pattern collapse, as shown in FIG. 3.

In addition, the photoresist must have a predetermined thickness, approximately 1~3 μm, in order to etch the DTI region 17. Therefore, it has a disadvantage of reducing process margin when performing the mask process.

SUMMARY OF THE INVENTION

Therefore, the present invention has been made to solve the above problems. An object of the present invention is to provide a method for fabricating a semiconductor memory device capable of simplifying formation process of trench isolation regions with different depths and increasing mask process margin.

In order to accomplish the above object, the present invention provides a method for fabricating a semiconductor memory device with a photoresist of increased etch selectivity by changing the physical properties of the photoresist in forming trench isolation regions with different depths.

The present invention comprises the steps of: depositing first and second insulating layers on a semiconductor substrate where (STI) regions and (DTI) regions are defined, forming the STI region by selectively etching the second and first insulating layers and the semiconductor substrate, forming a photoresist to cover the STI region and curing the surface thereof, and forming the DTI region by using the cured photoresist and the second insulating layer as a mask.

In the present invention, the curing step of the photoresist surface may include the high energy implantation of argon ions into the photoresist, preferably by employing an e-beam curing process. Furthermore, the implanted concentration of argon ions may be $10^{12 \sim 15}$ cm$^3$, the ion implantation energy may be 10~200 KeV, and the energy of the e-beam curing process may be 1000~2000 uC/cm$^2$.

DETAILED DESCRIPTION OF THE INVENTION

The above objects, and other features and advantages of the present invention will become more apparent after reading the following detailed description taken in conjunction with the appended drawings.

FIGS. 4A to 4D are cross-sectional views showing a method for fabricating a semiconductor memory device according to a preferred embodiment of the present invention.

Figure 1A:
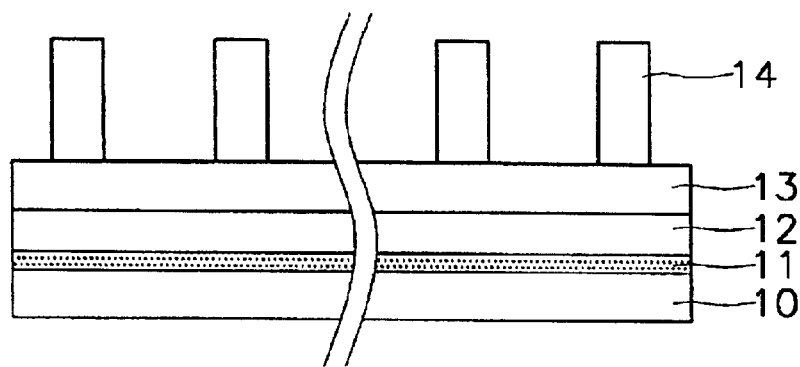
FIGS. 1A to 1D are cross-sectional views showing a conventional method for fabricating a semiconductor memory device.
Figure 1B:
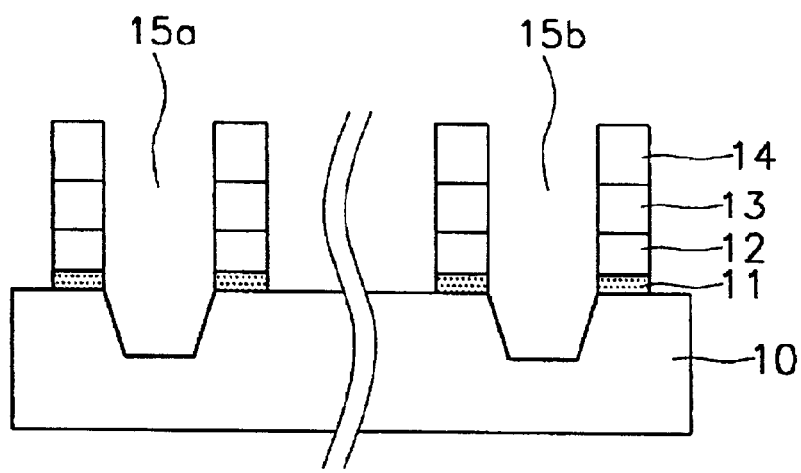
Figure 1C:
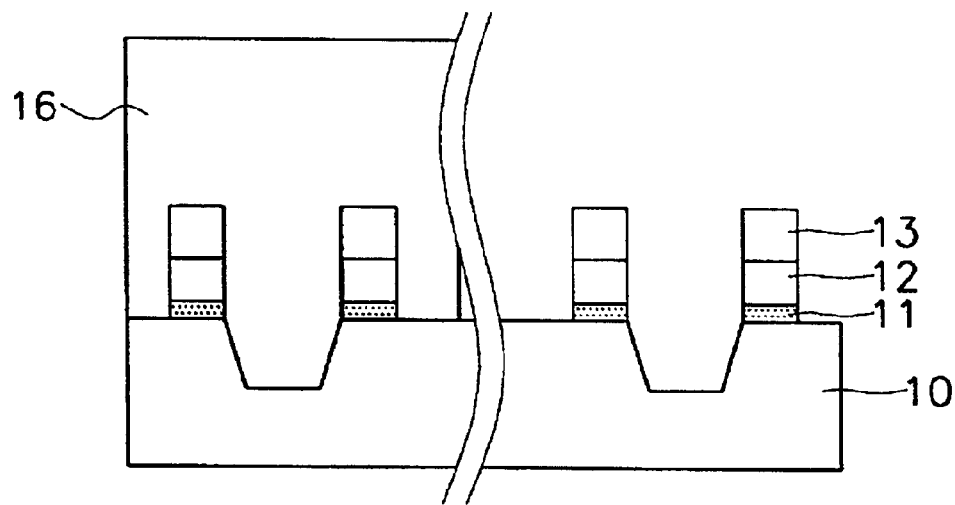
Figure 1D:
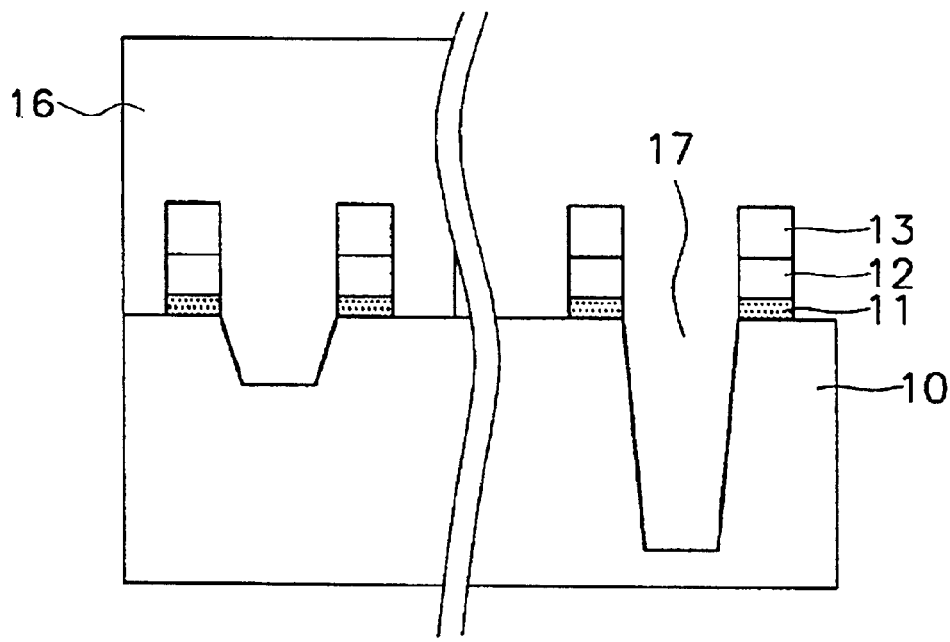
Figure 2:
FIG. 2 is a SEM photograph showing STI damage by a conventional method.
Figure 3:
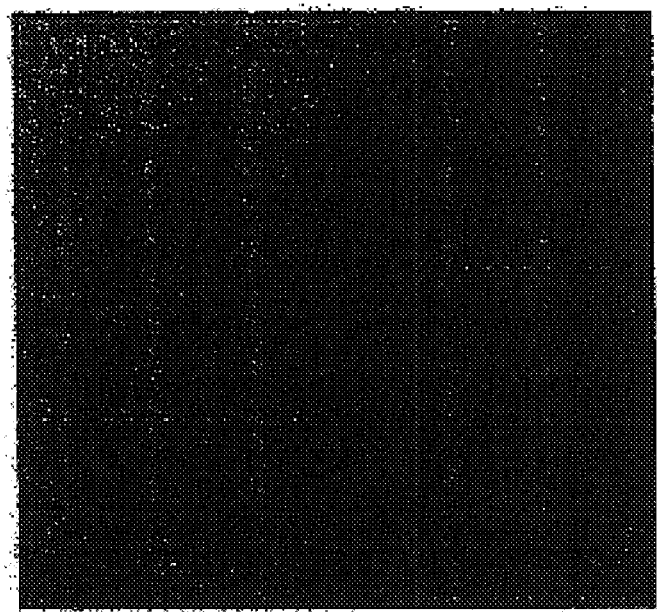
FIG. 3 is a SEM photograph showing pattern collapse in a conventional method.
Figure 3:
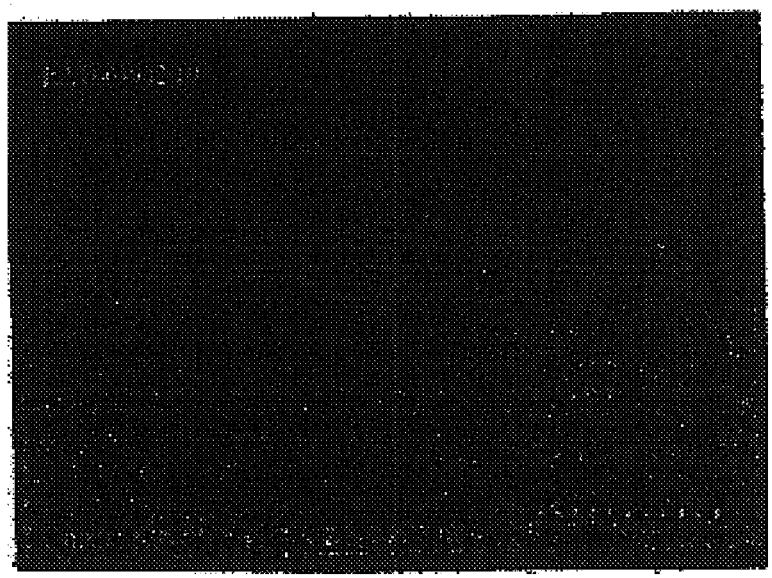
Figure 4A:
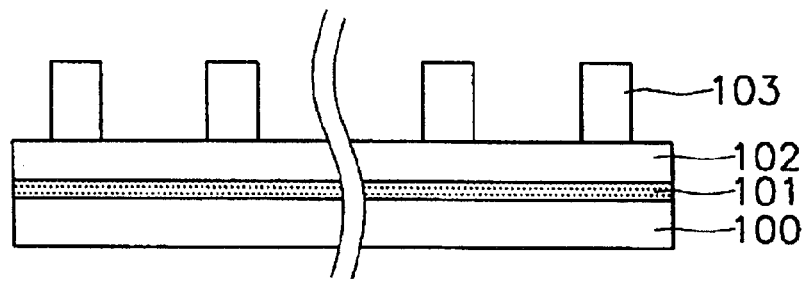
FIGS. 4A to 4D are cross-sectional views showing a method for fabricating semiconductor memory device according to a preferred embodiment of the present invention.

Referring to FIG. 4A, a STI formation region and a DTI formation region are defined on a semiconductor substrate 100 and first and second insulating layers 101,102 are sequentially deposited on the surface of the semiconductor substrate 100. For example, the first insulating layer 101 is a pad oxide layer and the second insulating layer 102 is a pad nitride layer.

Subsequently, a first photoresist 103 is deposited on the second insulating layer 102 and is selectively patterned by exposure and development process.

Figure 4B:
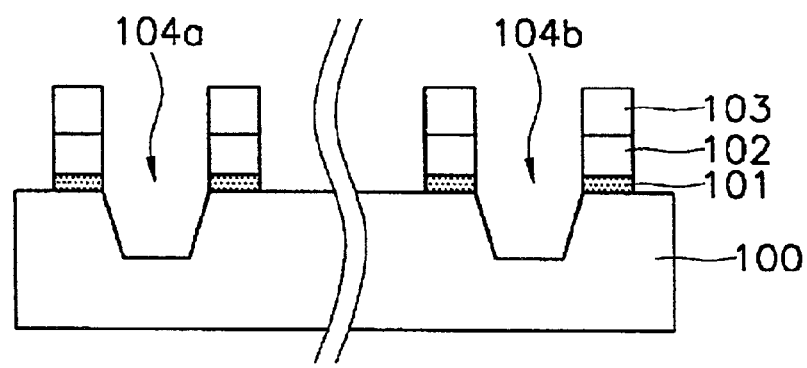

Referring to FIG. 4B, the first and second insulating layers 101,102 and the semiconductor substrate 100 are selectively etched off by using the patterned first photoresist 103 as a mask, thereby forming a plurality of STI regions 104a,104b. The STI regions 104a,104b have a depth of 2500~3000 Å from the surface of the semiconductor substrate 100.

Figure 4C:
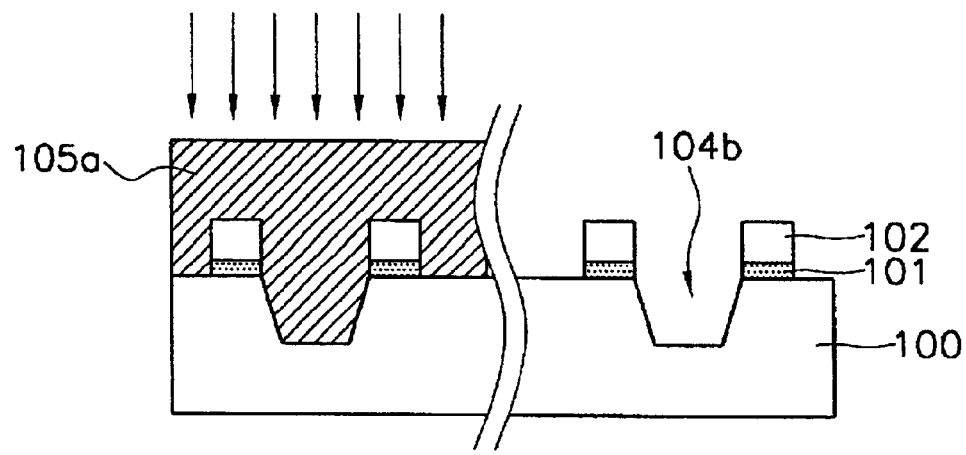
Figure 4D:
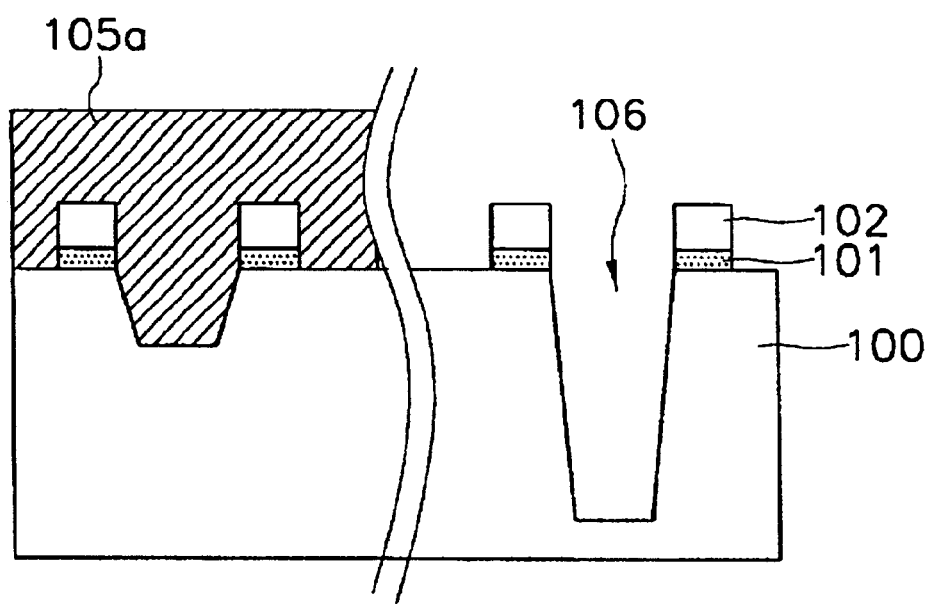

The patterned first photoresist 103 is removed and, referring to FIG. 4C, a second photoresist 105a is deposited and patterned by using exposure and development process, thereby exposing a DTI formation region. The exposure process of the second photoresist 105a is performed by selecting one light source among i-ray (365 nm), KrF (248 nm) and ArF (193 nm) for a corresponding photoresist material.

Subsequently, argon (Ar) ion implantation process is performed on the patterned second photoresist 105a, thereby curing the surface of the second photoresist 105a. Here, the implantation concentration of argon ions is $10^{12~15}$ cm$^3$ and ion implantation energy is 10~200 KeV. When high energy argon ions are implanted on the surface of the second photoresist 105a, the energy from the argon ions cause the photoresist polymers to crosslink, thereby increasing the hardening properties of the photoresist. Since argon gas is inert, it supplies only energy to the photoresist and since it has a high valence, it generates high energy.

Instead of using argon ion implantation process, e-beam curing process can be employed. The e-beam curing process is performed by passing high energy electrons through the surface of the second photoresist 105a to cause sudden crosslink of photoresist polymers and therefore, increase the etch resistance of the second photoresist 105. The e-beam curing process is performed in the energy range of 1000~2000 uC/cm$^2$. The disadvantage of e-beam curing process is the small damage generated on the upper part of photoresist. However, the disadvantage of the damage is relatively small compared to the greater advantage of increasing the etch resistance.

Once the surface of the second photoresist 105a is cured, the STI region (104b of FIG. 4C) of the semiconductor substrate 100 is etched more deeply by using the cured second photoresist 105a and the second insulating layer 102 as a mask, thereby forming a DTI region 106. The DTI region 106 has depth of 7000~8000 Å from the surface of the semiconductor substrate 100.

As described above, according to the present invention, it is possible to simplify the conventional method by skipping deposition and patterning process of the hard mask oxide layer.

It is also possible to prevent pattern collapse due to interfacial disharmony between hard mask oxide layer and the photoresist and to reduce the thickness of the photoresist to increase the mask process margin.

Although the preferred embodiment of this invention has been disclosed for illustrative purpose, those skilled in the art will appreciate that various modifications, alterations, additions and substitutions are possible, without departing from the scope and spirit of the invention.

What is claimed is:

1. A method for fabricating a semiconductor memory device, comprising the steps of:

depositing first and second insulating layers on a semiconductor substrate having a shallow trench isolation (STI) region and a deep trench isolation (DTI) region;

forming the STI region by selectively etching the second and first insulating layers and the semiconductor substrate;

forming a photoresist to cover the STI region and expose the DTI region;

curing a surface of the photoresist by implanting high energy argon ions or through an e-beam process, wherein an implanting concentration of argon ions is $10^{12~15}$ cm$^3$ and an implanting energy of argon ions is 10~200 KeV, said argon employed only to supply energy to said photoresist; and forming the DTI region by using only the cured photoresist and the second insulating layer as a mask.

2. The method according to claim 1, wherein the curing step of the photoresist surface is performed by an e-beam curing process in which high energy electrons are passed through the surface of the photoresist.

3. The method according to claim 2, wherein an energy of the e-beam curing process is 1000~2000 uC/cm$^2$.

4. The method according to claim 1, wherein the photoresist formation process includes an exposure process, which selects one light source among i-ray (365 nm), KrF (248 nm) and ArF (193 nm).

5. The method according to claim 1, wherein the first insulating layer is a pad oxide layer.

6. The method according to claim 1, wherein the second insulating layer is a pad nitride layer.

7. The method according to claim 1, wherein the STI region has a depth of 2500~3000 Å from a surface of the semiconductor substrate.

8. The method according to claim 1, wherein the DTI region has a depth of 7000~8000 Å from a surface of the semiconductor substrate.

* * * * *